(12) United States Patent
Ma et al.

(10) Patent No.: US 12,222,403 B2
(45) Date of Patent: Feb. 11, 2025

(54) BATTERY DEVICE, DETECTION METHOD THEREOF, AND SCREENING METHOD AND DEVICE OF BATTERY UNIT

(71) Applicant: CALB Co., Ltd., Jiangsu (CN)

(72) Inventors: Ruijun Ma, Changzhou (CN); Shihui Zhang, Changzhou (CN); Zhipeng Liu, Changzhou (CN); Qiru Li, Changzhou (CN)

(73) Assignee: CALB Co., Ltd., Jiangsu (CN)

( * ) Notice: Subject to any disclaimer, the term of this patent is extended or adjusted under 35 U.S.C. 154(b) by 290 days.

(21) Appl. No.: 17/855,810

(22) Filed: Jul. 1, 2022

(65) Prior Publication Data

US 2023/0366949 A1    Nov. 16, 2023

(30) Foreign Application Priority Data

May 12, 2022   (CN) .......................... 202210515569.6

(51) Int. Cl.
*G01R 31/396* (2019.01)
*G01R 31/36* (2020.01)

(52) U.S. Cl.
CPC ....... *G01R 31/396* (2019.01); *G01R 31/3646* (2019.01); *G01R 31/3648* (2013.01)

(58) Field of Classification Search
CPC ................ G01R 31/396; G01R 31/385; G01R 31/3646; G01R 31/3648; H01M 50/119; H01M 10/441; H01M 10/482

(Continued)

(56) References Cited

U.S. PATENT DOCUMENTS 10,353,009 B2 *   7/2019   Torai ................... H01M 10/482
2013/0335009 A1   12/2013  Katsumata et al.
(Continued)

FOREIGN PATENT DOCUMENTS

CA      2720136      10/2009
CN    102097657       6/2011
(Continued)

OTHER PUBLICATIONS

Raphaelwegmann et al., "Assessing the potential of a hybrid battery system to reduce battery aging in an electric vehicle by studying the cycle life of a graphite | NCA high energy and a LTO | metal oxide high power battery cell considering realistic test profiles", Applied Energy, Sep. 2018, pp. 197-212.

(Continued)

*Primary Examiner* — Raul J Rios Russo
*Assistant Examiner* — Trung Q Nguyen
(74) *Attorney, Agent, or Firm* — JCIP GLOBAL INC.

(57) ABSTRACT

The disclosure provides a battery device, a detection method thereof, and a screening method and device of a battery unit. A difference between characteristic values of any two battery units within a preset range is controlled. The characteristic value reflects the difference between polarization internal resistances of different battery units, thereby reflecting the consistency difference between different battery units. The solution can dynamically monitor the consistency of each battery unit in the battery device, which can reflect the consistency of the battery unit during the usage process to implement the online monitoring of the battery unit, thereby providing guidance for the subsequent use of the battery device.

19 Claims, 3 Drawing Sheets

(58) Field of Classification Search
USPC .................. 324/500, 551, 425–434, 702.063
See application file for complete search history.

(56) References Cited

U.S. PATENT DOCUMENTS

| | | | |
|---|---|---|---|
| 2017/0366023 A1* | 12/2017 | Tanaka | H01M 10/425 |
| 2021/0359347 A1* | 11/2021 | Stefanopoulou | H01M 10/0525 |
| 2022/0075000 A1 | 3/2022 | Cha et al. | |
| 2022/0158468 A1* | 5/2022 | Cha | B60L 3/12 |
| 2022/0299577 A1* | 9/2022 | Konishi | G01R 31/367 |

FOREIGN PATENT DOCUMENTS

| | | |
|---|---|---|
| CN | 107020251 | 8/2017 |
| CN | 110579716 | 12/2019 |
| CN | 112505551 | 3/2021 |

OTHER PUBLICATIONS

"Search Report of Europe Counterpart Application", issued on Jan. 3, 2023, p. 1-p. 5.
Office Action of China Counterpart Application, with English translation thereof, issued on Jun. 27, 2022, pp. 1-8.

* cited by examiner

BATTERY DEVICE, DETECTION METHOD THEREOF, AND SCREENING METHOD AND DEVICE OF BATTERY UNIT

CROSS-REFERENCE TO RELATED APPLICATION

This application claims the priority benefit of China application serial no. 202210515569.6, filed on May 12, 2022. The entirety of the above-mentioned patent application is hereby incorporated by reference herein and made a part of this specification.

BACKGROUND

Technical Field

The disclosure relates to the field of battery technology, in particular to a battery device, a detection method thereof, and a screening method and device of a battery unit.

Description of Related Art

During the preparation process of single batteries, due to the differences between batches of materials and limitations of battery manufacturing processing such as pulping, coating, and rolling, even if the single batteries are manufactured in the same batch, there will inevitably be differences in consistency between single batteries caused by the manufacturing process, resulting in differences between the single batteries obtained. If the single batteries are directly grouped, it will lead to differences between battery groups, such that the consistency between the single batteries in the battery group is poor. Therefore, before the batteries are grouped, the batteries are screened for consistency to select single batteries with good consistency for grouping.

In the prior art, the single batteries with good consistency of indicators such as battery voltage, internal resistance, and capacity are usually selected for grouping. However, after the single batteries are just manufactured, and the single batteries with good consistency are screened out through indicators such as battery voltage, internal resistance, and capacity, and are assembled into battery groups, there is usually a period of storage and shelving before the batteries are loaded onto vehicles. The storage process usually ranges from a few months to a year. During the storage process, a series of electrochemical changes spontaneously occur inside the single batteries, causing the consistency between the single batteries to worsen again.

Therefore, providing a battery group which can still have good consistency between single batteries after a period of storage and shelving is a technical issue to be solved urgently by persons skilled in the art.

SUMMARY

Embodiments of the disclosure provide a battery device, a detection method thereof, and a screening method and device of a battery unit.

According to a first aspect, an embodiment of the disclosure provides a battery device, which includes at least two battery units. A difference between characteristic values of any two of the battery units is within a preset range.

The preset range is 0.5% to 40%.

Each one of the characteristic values is obtained by adopting the following test.

When any one of the battery units is discharged at a discharge rate of 0.05 C and a discharge rate of 1 Capacity (C) respectively in a discharge voltage interval of 2.8 Volt (V) to 4.2V, two discharge differential voltage analysis (DVA) curves are obtained. A difference between minimum values of the discharge DVA curves is determined.

According to a second aspect, an embodiment of the disclosure provides a screening method of a battery unit, which includes the following.

A characteristic value of each of multiple battery units to be selected is determined. The characteristic value is determined according to a minimum value of a discharge DVA curve of the battery unit.

A difference between the characteristic values of any two of the battery units is calculated.

The battery unit with the difference between the characteristic values of any two of the battery units within a preset range is selected for grouping.

Determining the characteristic value of each of the battery units specifically includes the following.

For any one of the battery units, the following process is executed.

According to N different preset discharge conditions, any one of the battery units is respectively discharged to obtain N corresponding discharge DVA curves, where N is an integer greater than 1.

The minimum value in each of the discharge DVA curves is determined.

The difference between any two of the minimum values is calculated.

According to the calculated difference between the minimum values, the characteristic value of one of the battery unit is determined.

According to a third aspect, an embodiment of the disclosure provides a detection method of a battery device, which includes the following.

When the battery device includes multiple battery units, a characteristic value of each of the battery units is determined. The characteristic value is determined according to a minimum value of a discharge DVA curve of the battery unit.

A difference between the characteristic values of any two of the battery units is calculated.

According to the difference between the characteristic values of any two of the battery units, a consistency of the battery device is determined.

Determining the characteristic value of each of the battery units specifically includes the following.

For any one of the battery units, the following process is executed.

According to N different preset discharge conditions, any one of the battery units is respectively discharged to obtain N corresponding discharge DVA curves, where N is an integer greater than 1.

The minimum value in each of the discharge DVA curves is determined.

The difference between any two of the minimum values is calculated.

According to the calculated difference between the minimum values, the characteristic value of one of the battery units is determined.

According to a fourth aspect, an embodiment of the disclosure provides a screening device of a battery unit, which includes the following.

A memory is used to store a program instruction.

A processor is used to call the program instruction stored in the memory to execute the screening method provided by the embodiment of the disclosure according to an obtained program.

According to a fifth aspect, an embodiment of the disclosure provides a detection device of a battery device, which includes the following.

A memory is used to store a program instruction.

A processor is used to call the program instruction stored in the memory to execute the detection method provided by the embodiment of the disclosure according to an obtained program.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances proportions may have been exaggerated, so as to emphasize and clearly illustrate the features described herein. In addition, related elements or components can be variously arranged, as known in the art. Further, in the drawings, like reference numerals designate same or like parts throughout the several views.

DETAILED DESCRIPTION OF DISCLOSED EMBODIMENTS

Figure 1:
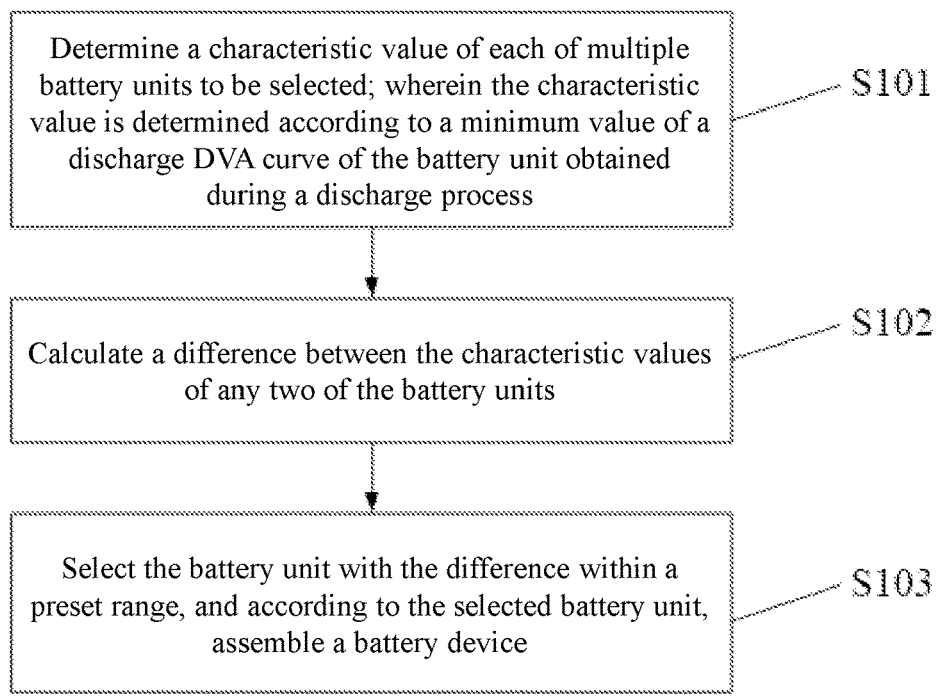
FIG. 1 is a flowchart of a screening method of a battery unit according to an embodiment of the disclosure.

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more. The term "and/or" includes any and all combinations of one or more of the associated listed items.

In particular, a reference to "the" object or "a" and "an" object is intended to denote also one of a possible plurality of such objects. Unless otherwise defined or described, the terms "connect", "fix" should be broadly interpreted, for example, the term "connect" can be "fixedly connect", "detachably connect", "integrally connect", "electrically connect" or "signal connect". The term "connect" also can be "directly connect" or "indirectly connect via a medium". For the persons skilled in the art, the specific meanings of the abovementioned terms in the present disclosure can be understood according to the specific situation.

Further, in the description of the present disclosure, it should be understood that spatially relative terms, such as "above", "below" "inside", "outside" and the like, are described based on orientations illustrated in the figures, but are not intended to limit the exemplary embodiments of the present disclosure.

In the context, it should also be understood that when an element or features is provided "outside" or "inside" of another element(s), it can be directly provided "outside" or "inside" of the other element, or be indirectly provided "outside" or "inside" of the another element(s) by an intermediate element.

The specific implementations of a battery device, a detection method thereof, a screening method and device of a battery unit provided by the embodiments of the disclosure will be described in detail below with reference to the drawings. It should be noted that the described embodiments are only a part, but not all, of the embodiments of the disclosure. Based on the embodiments of the disclosure, all other embodiments obtained by persons skilled in the art without creative efforts shall fall within the protection scope of the disclosure.

During research, it is discovered that when screening battery units, in the current technology, charge and discharge tests may be continuously performed on the battery units under multiple simulated usage states to obtain a differential curve of a differential result of power and voltage (may be expressed as dQ/dV) and voltage, and then screened based on a peak value in the differential curve.

The screening method has the following issues.

1. The charge and discharge tests need to be performed under the simulated usage states, and the simulated usage states are complicated, resulting in harsh test conditions and difficult implementation.

2. Since the charge and discharge tests are continuously performed under the simulated usage states, the discharge voltage interval is large and time consuming, resulting in low screening efficiency.

3. Peaks in the differential curve represent cases of an electrochemical reaction platform, and the number of peaks corresponds to the number of electrochemical reaction platforms. Therefore, when screening through the differential curve, it is essentially based on the difference between the electrochemical reaction platforms, and the stability of the battery unit is examined, such that the consistency of the battery units screened out in this way may not be high.

4. Since the peaks in the differential curve represent the cases of the electrochemical reaction platform, when screening, it is necessary to screen from multiple parameters. For example, the difference between voltages corresponding to the peaks in each curve reflects the difference in size of the electrochemical reaction platform corresponding to each battery unit, and the difference between the differential values of the peaks in each curve and the difference between areas of the peaks reflect the difference in length of the electrochemical reaction platform corresponding to each battery unit. In this way, screening from multiple parameters causes the screening process to be complicated.

In order to solve the above issues, the embodiments of the disclosure provide a battery device, a detection method thereof, and a screening method and device of a battery unit, which are used to perform simple, fast, and effective screening and grouping of battery units under simple test conditions.

An embodiment of the disclosure provides a battery device, which includes at least two battery units. A difference between characteristic values of any two of the battery units is within a preset range.

The preset range is 0.5% to 40%.

The characteristic value is obtained by adopting the following test.

When the battery unit is discharged at a discharge rate of 0.05 C and a discharge rate of 1 C respectively in a discharge voltage interval of 2.8V to 4.2V, two discharge DVA curves are obtained. A difference between minimum values of the discharge DVA curves is determined.

The number of battery units included in the battery device may be set according to actual requirements, which is not limited herein.

In this way, through controlling the difference between the characteristic values of any two battery units within the preset range, the difference between the characteristic values of any two battery units is small, so that there is good consistency between the battery units. Also, the battery groups screened in this way still have good consistency after storage and shelving, such that the consistency between the battery units does not deteriorate after a certain period of storage, so that the battery device can have an excellent performance.

In addition, the characteristic value is determined according to the minimum value of the discharge DVA curve, so that the characteristic value reflects the difference between polarization internal resistances of different battery units, thereby reflecting the consistency difference between different battery units.

In addition, when grouping, only one parameter of the characteristic value is required to implement the grouping, which simplifies the grouping process and improves the grouping efficiency. Moreover, the characteristic value is determined under a simple test condition according to the obtained discharge DVA curve, which is easier to implement and is less time consuming. Also, the consistency of the battery units after grouping is also good.

Taking the discharge rate of 1 C as an example, the meanings expressed include the following.

C in the discharge rate represents the discharge current of the battery unit and 1 C in the discharge rate represents 1 time of the capacity of the battery unit. If the capacity of the battery unit is 2.5 Ah, 1 C is 2.5 A.

Therefore, the discharge rate of 1 C is adopted for discharge, that is, the discharge current of 2.5 A is adopted for discharge.

In some embodiments, the capacity of the battery unit may be obtained by adopting, but not limited to, the following manner.

Under an environment of 25° C., let the battery unit stand for 4 hours. After the temperature of the battery unit is stable, the following process is executed.

Step 1: Adopt a discharge current of 5 A to discharge the battery unit with constant current and discharge to 2.8V.

Step 2: Let the battery unit stand for 5 minutes.

Step 3: Adopt a charging current of 5 A to charge with constant current to 4.2V, and then charge with constant voltage until the current is less than or equal to 1 A.

Step 4: Let the battery unit stand for 5 minutes.

Step 5: Adopt a discharge current of 5 A to discharge the battery unit with constant current and discharge to 2.8V.

Step 6: Record a discharge capacity when completing Step 5, and use the discharge capacity as the capacity of the battery unit.

Alternatively, in some embodiments, other manners that can determine the battery capacity may also be adopted for determination, which is not limited to the above process.

Alternatively, in some embodiments, if the capacity of the battery unit may be directly obtained through parameters of the battery unit, the above process does not need to be adopted to confirm the capacity again.

In some embodiments, the preset range may further be set to 2% to 25%.

The consistency difference of the battery units caused by defects of a manufacturing process can reduce the available capacity of the battery device, and reduce the cycle life and the safety of the battery device. Therefore, further setting the preset range to be 2% to 25% can effectively prevent the consistency difference of the battery units caused by the defects of the manufacturing process, such that the consistency difference of each battery unit is smaller, so that each battery unit can have good consistency.

In some embodiments, since the preset range is presented as percentages, the corresponding difference may be understood as a relative difference.

In actual situations, the difference between the characteristic values is not limited to the relative difference between the characteristic values. The said difference may also be an absolute difference, and the preset range at this time may be set according to the difference between the characteristic values of normal battery units (or conventional battery units with good consistency), which is not limited herein.

In some embodiments, the characteristic value may be set to be in a range of 0.01 to 0.15.

Since the battery unit adopts different discharge rates during discharge and adopts the same discharge voltage interval for discharge twice, two corresponding discharge DVA curves may be obtained. If the polarization internal resistance of the battery unit remains unchanged, the difference between the two discharge DVA curves may come from the difference in discharge rate.

Moreover, since the characteristic value is determined based on the difference between the minimum values of the two discharge DVA curves, the smaller the said difference, the smaller the change in polarization internal resistance of the battery unit, and the better the stability of the battery unit.

Therefore, when the characteristic value is in a range of 0.01 to 0.15, it means that the polarization internal resistance of the battery unit does not change greatly, and the stability of the battery unit is good.

Further, in some embodiments, the characteristic value may be set to be in a range of 0.04 to 0.1.

In this way, it can be further explained that when the polarization internal resistance of the battery unit does not change greatly, the stability of the battery unit is good.

In some embodiments, when the battery unit is discharged by adopting the above test process, voltage data, capacity data, power data, and time data may be obtained, thereby obtaining the differential result (that is, dV/dQ) of voltage and power. Then, the corresponding relationship between the differential result and capacity is established to obtain the discharge DVA curve.

Based on the same inventive concept, an embodiment of the disclosure provides a screening method of a battery unit, as shown in FIG. 1, which includes the following.

In S101, a characteristic value of each of multiple battery units to be selected is determined, wherein the characteristic value is determined according to a minimum value of a discharge DVA curve of the battery unit during a discharge process.

In S102, a difference between the characteristic values of any two battery units is calculated.

In S103, the battery unit with the difference between the characteristic values of any two battery units within a preset range is selected.

Determining the characteristic value of each of the battery units specifically includes the following.

For any one of the battery units, the following process is executed.

According to N different preset discharge conditions, any one of the battery units is respectively discharged to obtain N corresponding discharge DVA curves, where N is an integer greater than 1.

The minimum value in each of the discharge DVA curves is determined.

The difference between any two of the minimum values is calculated.

According to the calculated difference between the minimum values, the characteristic value of the one of the battery unit is determined.

Figure 2:
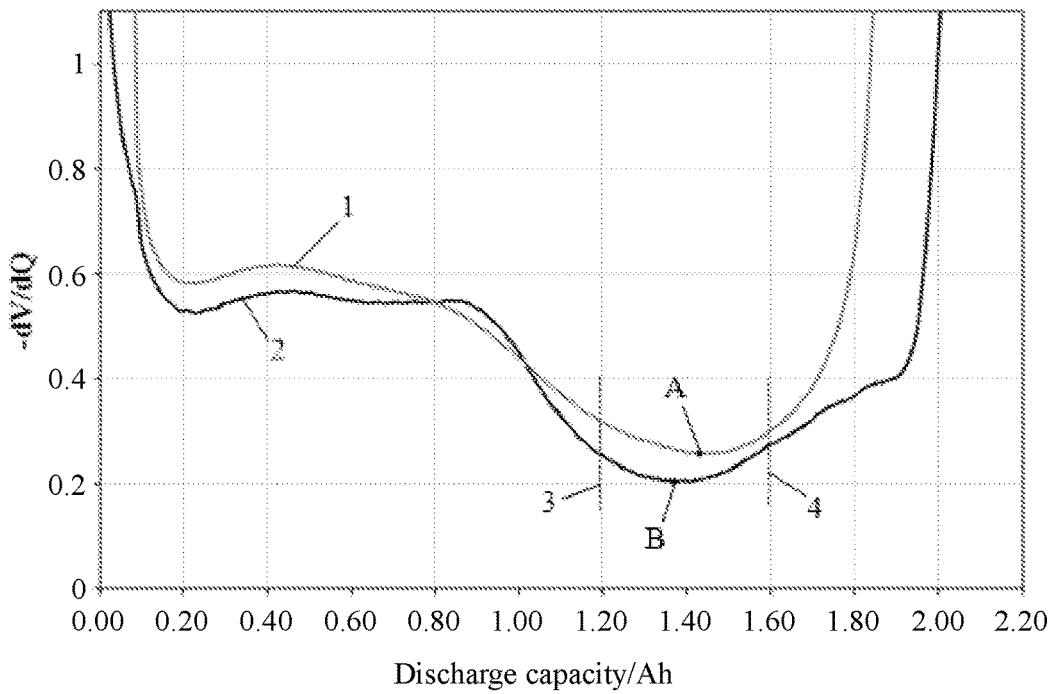
FIG. 2 is a schematic diagram of a discharge DVA curve according to an embodiment of the disclosure.

For example, taking N as 2 and a certain battery unit (referred to as a battery unit M1) as an example, after the battery unit M1 is discharged by adopting two different preset discharge conditions respectively, 2 corresponding discharge DVA curves may be obtained. As shown in FIG. 2, a solid line 1 and a solid line 2 respectively represents the two discharge DVA curves. Minimum values (as shown by points A and B in FIG. 2) in the two discharge DVA curves are respectively found and a difference between the two minimum values is calculated. The calculated difference is used as a characteristic value of the battery unit M1.

In FIG. 2, –dV/dQ represents a differential of voltage and power.

Selected battery units may be used to assemble a battery device.

In this way, through controlling the difference between the characteristic values of any two battery units within a preset range, there is good consistency between the battery units, so that the battery device can have an excellent performance.

Moreover, the characteristic value is determined according to the minimum value of the discharge DVA curve during a discharge process of the battery unit, so that the characteristic value reflects the difference between polarization internal resistances of different battery units, thereby reflecting the consistency difference between different battery units. When the battery units are screened out based on the characteristic values, there can be good consistency between the screened battery units.

When N is an integer greater than 2, there may be multiple calculated differences between the minimum values of the discharge DVA curves.

A mean of the said differences may be calculated, and the mean may be used as the characteristic value of the battery unit.

Alternatively, a maximum value may be selected from the differences between the minimum values as the characteristic value of the battery unit.

Alternatively, a minimum value may be selected from the differences between the minimum values as the characteristic value of the battery unit.

In this way, the characteristic value of the battery unit may be determined based on the discharge DVA curve obtained during discharge to screen out the battery unit with good consistency based on the characteristic value of each battery unit, such that the assembled battery device has excellent consistency, so that the battery device has excellent charging and discharging performances, and adverse effects caused by a wooden barrel are effectively eliminated.

Of course, in some embodiments, in addition to determining the characteristic value of the battery unit according to the above method, the characteristic value may also be determined according to, but not limited to, the following method.

When the minimum value in the discharge DVA curve is determined, a ratio of any two minimum values in the discharge DVA curve may be calculated. Then, based on a mean of the ratios (or a maximum value or a minimum value in the ratios) in the discharge DVA curve, the characteristic value of the battery unit is determined.

Alternatively, only one preset discharge condition is adopted to discharge the battery unit. One corresponding discharge DVA curve is obtained. A minimum value and a second minimum value in the discharge DVA curve are found. Based on a difference or a ratio of the minimum value and the second minimum value in the discharge DVA curve, the characteristic value of the battery unit is determined.

In other words, during specific implementation, the method for determining the characteristic value of the battery unit may be selected according to actual requirements to meet the requirements of different application scenarios and improve the flexibility of design.

In some embodiments, the preset discharge condition includes the following.

A preset discharge rate.

According to a discharge DVA curve obtained by discharging a fully charged battery unit, a discharge voltage interval is determined.

The preset discharge rates in the different preset discharge conditions are different, and the discharge voltage intervals in the different preset discharge conditions are the same.

Specifically, the discharge rate may be set according to actual requirements, for example, but not limited to, 0.05 C or 1 C, which is not limited herein.

Specifically, according to the discharge DVA curve obtained when the fully charged battery unit is discharged, determining the discharge voltage interval may specifically include the following.

A fully charged battery unit (denoted as a battery unit M2) is selected.

According to a preset discharge rate, the battery unit M2 is discharged to obtain a corresponding discharge DVA curve, such as a curve (denoted as a curve 1) represented by the solid line 1 in FIG. 2.

A discharge capacity interval (between a dashed line 3 and a dashed line 4 in FIG. 2) including a minimum value is selected from the curve 1.

Based on the corresponding relationship between the discharge capacity and the discharge voltage, a discharge voltage corresponding to the selected discharge capacity interval is determined as a discharge voltage interval.

For example, if the discharge voltage corresponding to the discharge capacity of 1.2 Ah corresponding to the dashed line 3 is U1, and the discharge voltage corresponding to the discharge capacity of 1.6 Ah corresponding to the dashed line 4 is U2, the discharge voltage interval is U1 to U2.

When the discharge voltage interval is determined, the discharge voltage interval may be adopted when the battery unit is subsequently discharged.

It should be emphasized that through controlling different discharge rates, the difference between the minimum values of the discharge DVA curves is controlled within the preset range, that is, the electrochemical polarization and the concentration polarization of the battery unit are controlled to be small, thereby reducing the probability of spontaneous electrochemistry of the battery unit to reduce phenomenon such as self-discharge of the battery unit and redox decomposition of electrolyte, so that the consistency between the battery units is still good.

In some embodiments, the method for determining the preset range specifically includes the following.

M battery unit samples are determined, where M is an integer greater than 1.

A characteristic value of each battery unit sample is determined.

A mean and a variance of the characteristic values are calculated respectively.

According to the mean and the variance of the characteristic values, the preset range is determined.

When a represents the said mean and b represents the said variance, the preset range may be [a−xb, a+xb], and x may be set to 1, 2, 3, or a greater value and may be set according to actual requirements, which is not limited herein.

In this way, the preset range determined in the above manner has a more reliable reference and is closer to the real situation. Using the preset range to screen out the battery units can be beneficial to improving the consistency of the screened battery units.

Of course, in some embodiments, in addition to determining the preset range based on the above method, the preset range may also be determined based on the following method.

The preset range is set according to experience.

Alternatively, [a−w, a+w] is taken as the preset range, where a represents the mean of the characteristic values and w represents the allowable error determined according to experience.

In other words, during specific implementation, the method for determining the preset range may be selected according to actual requirements to meet the requirements of different application scenarios and improve the flexibility of design.

An example is illustrated below.

1. An example for the determination of the preset range is illustrated.

Taking a soft pack single battery, discharge rates of 0.05 C and 1 C, a discharge voltage interval of 3.4V to 3.7V, and x in the preset range (i.e., [a−xb, a+xb]) being 3 as an example.

For any single battery, any single battery is discharged at two discharge rates of 0.05 C and 1 C respectively between 3.4V and 3.7V to obtain two discharge DVA curves. Minimum values in the two discharge DVA curves are found. A difference between the two minimum values found is used as a characteristic value of the single battery.

At this time, the obtained characteristic values may respectively be 0.0501, 0.05075, 0.04849, 0.04764, 0.04798 . . . .

A mean of the characteristic values is calculated to be 0.05125 and a variance is 0.00295.

At this time, a−3b is 0.0424 and a+3b is 0.0601, so the preset range is [0.0424, 0.0601].

2. An example for the screening process is illustrated.

Taking a soft pack single battery, discharge rates of 0.05 C and 1 C, and a discharge voltage interval of 3.4V to 3.7V as an example.

Each single battery to be selected is discharged at two discharge rates of 0.05 C and 1 C respectively between 3.4V and 3.7V to obtain two discharge DVA curves. Minimum values in the two discharge DVA curves are found. A difference between the two minimum values found is used as a characteristic value of the single battery.

Figure 3:
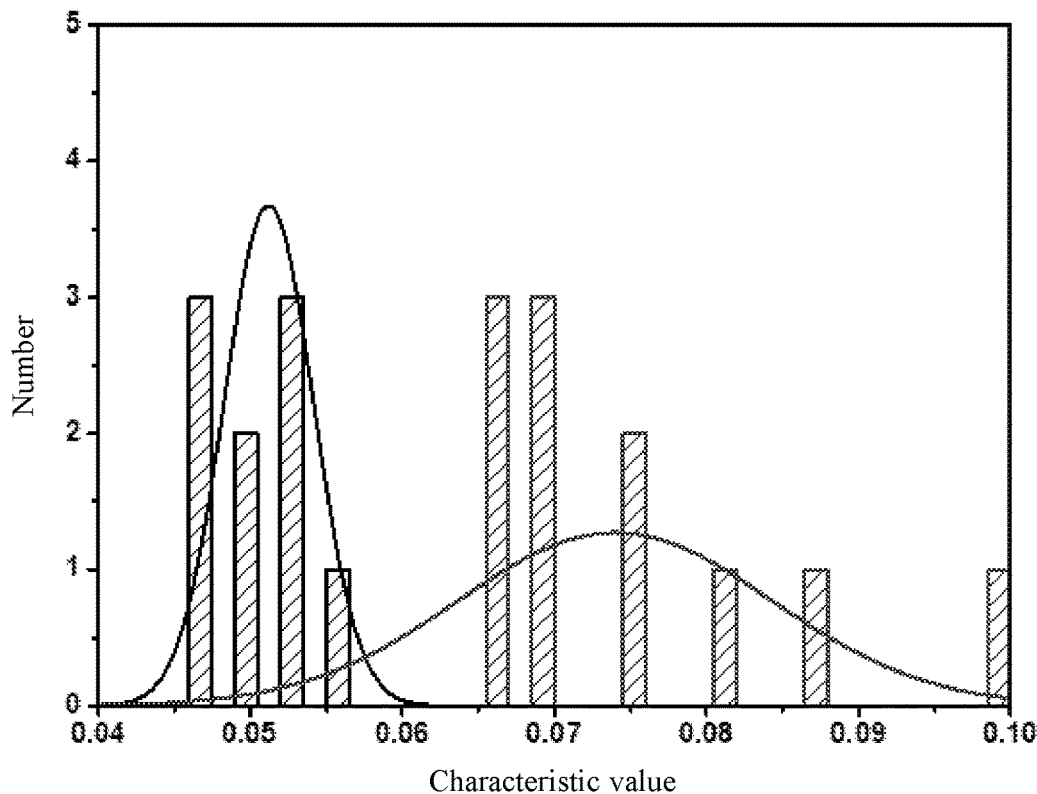
FIG. 3 is a bar chart of a statistical result of a characteristic value of a single battery according to an embodiment of the disclosure.

With reference to FIG. 3, single batteries with characteristic values between [0.0424, 0.0601] are screened out to be assembled into a battery device.

In FIG. 3, the abscissa represents the characteristic value, the ordinate represents the number, and each bar represents the number of single batteries corresponding to the characteristic value.

Moreover, with reference to FIG. 3, the single batteries with the characteristic values between [0.0424, 0.0601] may be regarded as single batteries with good consistency, and single batteries with characteristic values outside [0.0424, 0.0601] may be regarded as single batteries with poor consistency.

3. The battery device of multiple systems is illustrated.

In order to better reflect the performance of the battery device assembled from the battery units screened out based on the characteristic values, the battery device of a ternary system is selected as an example for illustration. The specific results may be seen in Table 1.

In Table 1, 4 # is a comparative example, a represents the mean mentioned in the above content, b represents the variance mentioned in the above content, k represents the maximum value in relative differences of characteristic values of any two battery units when the battery device includes multiple (that is, two or more) battery units, and the number of turns represents the number of usage cycles of the battery device when the battery device adopts step charging at 25° C. and the battery health state of the battery unit decays from 100% to 80%.

TABLE 1

| | Serial number of example | | | |
|---|---|---|---|---|
| | 1# | 2# | 3# | 4# |
| b | 0.2 | 3 | 2 | 6 |
| a − 3b | 0.05062 | 0.04240 | 0.04534 | 0.03359 |
| a + 3b | 0.05180 | 0.06002 | 0.05708 | 0.06883 |
| a | 0.00117 | 0.01762 | 0.1174 | 0.03523 |
| k | 2% | 35% | 23% | 69% |
| Number of turns | 1986 | 1586 | 1765 | 745 |

From Table 1, the following conclusions may be drawn.

Firstly, it can be determined from Example 1 #, Example 2 #, and Example 3 # that with the increase in k, the number of turns gradually decreases, that is, with the increase of the maximum value in the relative differences between the characteristic values of any two battery units, the number of usage cycles gradually decreases when the battery device reaches a target state (that is, the state when the battery health state of the battery unit decays from 100% to 80%). Also, the smaller the k, the better the consistency, and the better the consistency. The greater the number of usage cycles of the battery device when reaching the target state, the more stable the performance of the battery device, and the longer the service life.

Secondly, it can be determined from Example 1 # and Comparative Example 4 # that k of Comparative Example 4 # is obviously much greater thank of Example 1 #. Correspondingly, the number of usage cycles of the battery device of Comparative Example 4 # when reaching the target state is correspondingly much less, which also confirms that the better the consistency, the more stable the performance of the battery device, and the longer the service life, while the worse the consistency, the more unstable the performance of the battery device, the faster the decay speed, and the shorter the service life.

It should be emphasized that the peak of the discharge DVA curve represents the phase transition of an active material during intercalation and deintercalation processes, and the process of phase transition reflects the change in polarization internal resistance.

In addition, the characteristic value determined based on the minimum value of the discharge DVA curve of the battery unit obtained during the discharge process may reflect the difference in polarization internal resistance of the battery unit, thereby reflecting the consistency difference between the battery units.

The relationship between the voltage and the power of the battery unit may be derived with reference to the following formula.

$$V=OCV-\eta=OCV-I\times DCR;$$

$$dV/dQ=dOCV/dQ-d(I\times DCR)/dQ;$$

$$Q=I\times t;$$

$$dV/dQ=dOCV/dQ-d(I\times DCR)/d(I\times t);$$

when $I$ is constant, $dV/dQ=dOCV/dQ-dDCR/dt;$ $$dV/dQ-dOCV/dQ=-dDCR/dt.$$

where V represents the voltage of the battery unit under load, OCV represents the open-circuit voltage of the battery unit, I represents the current in the battery unit during discharge, t represents the discharge time, DCR represents the direct current internal resistance of the battery unit, $\eta$ represents the polarization voltage of the battery unit, and Q represents the power of the battery unit during discharge.

Through the derivation process of the above formula, the change in polarization internal resistance of the battery unit during the discharge process may be reflected. Therefore, through discharging at different discharge rates, the difference in polarization internal resistance during the discharge process may be reflected, thereby judging the consistency difference between the battery units based on the difference between the characteristic values.

Moreover, the polarization resistance of the battery unit may include ohmic polarization internal resistance, electrochemical polarization internal resistance, and concentration polarization internal resistance. The magnitude of the polarization internal resistance determines the magnitude of the polarization voltage. If the polarization internal resistance is too large, it means that the internal resistance of the battery unit is too large, and that ion migration in the battery unit is difficult, which seriously affects the rate and the cycle performance of the battery unit.

Therefore, the polarization internal resistance may be used as a parameter that reflects the comprehensive performance of internal electrolyte, cathode and anode active materials, and diaphragm matching of the battery unit, thereby evaluating the performance of the battery unit, so that through testing the polarization internal resistances of the battery units, the battery units with good performance consistency can be quickly screened out to control the consistency of the battery group.

Figure 4:
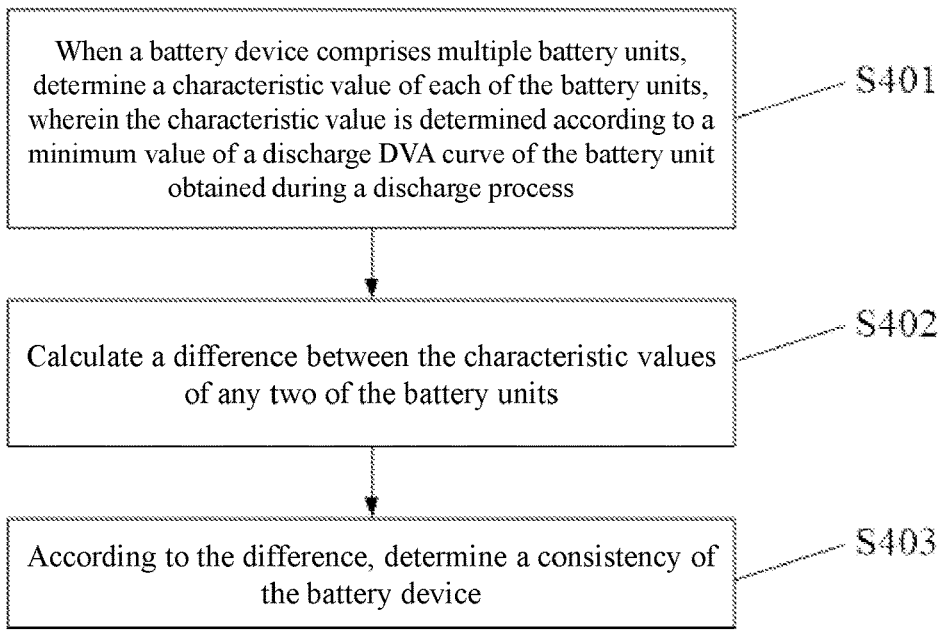
FIG. 4 is a flowchart of a detection method of a battery device according to an embodiment of the disclosure.

Based on the same inventive concept, an embodiment of the disclosure provides a detection method of a battery device, as shown in FIG. 4, which includes the following.

In S401, when a battery device includes multiple battery units, a characteristic value of each battery unit is determined, wherein the characteristic value is determined according to a minimum value of a discharge DVA curve of the battery unit obtained during a discharge process.

For the specific determination process of the characteristic value of each battery unit, reference may be made to the above content, which will not be described in detail here.

In S402, a difference between the characteristic values of any two battery units is calculated.

In S403, according to the difference between the characteristic values of any two battery units, a consistency of the battery device is determined.

Determining the characteristic value of each battery unit includes the following.

For any battery unit, the following process is executed.

According to N different preset discharge conditions, any one of the battery units is respectively discharged to obtain N corresponding discharge DVA curves, where N is an integer greater than 1.

A minimum value in each of the discharge DVA curves is determined.

A difference between any two of the minimum values is calculated.

According to the calculated difference between the minimum values, the characteristic value of the one of the battery unit is determined.

In this way, the solution can dynamically monitor the consistency of each battery unit in the battery device, which can reflect the consistency of the battery unit during the usage process to implement the online monitoring of the battery unit, thereby providing guidance for the subsequent use of the battery device.

In addition, the detection method takes a short time, and the test cost is low, so that low cost, fast, and effective detection can be implemented.

In some embodiments, according to the difference between the characteristic values of the battery units, determining the consistency of the battery device specifically includes the following.

A maximum value in all the differences between the characteristic values of the battery units is determined.

According to a preset corresponding relationship between a difference range and a consistency level, a consistency level corresponding to a difference range where the maximum value is located is determined.

For example, the corresponding relationship between the difference range and the consistency level may be shown in Table 2.

TABLE 2

| Difference range | Consistency level |
| --- | --- |
| [c1, c2) | Good |
| [c2, c3) | Medium |
| [c3, c4) | Poor |

Assuming that the determined difference range where the maximum value is located is [c2, c3), it means that the consistency level of the battery device is medium, indicating that the performance and the service life of the battery device are both average.

Assuming that the determined difference range where the maximum value is located is [c1, c2), it means that the consistency level of the battery device is good, indicating that the performance and the service life of the battery device are both good.

Assuming that the determined difference range where the maximum value is located is [c3, c4), it means that the consistency level of the battery device is poor, indicating that the performance and the service life of the battery device are both poor.

Of course, the corresponding relationship between the difference range and the consistency level is not limited to that shown in Table 2. Here, Table 2 is used as an example for illustration. In actual situations, the corresponding relationship between the difference range and the consistency level may be preset according to actual requirements, which is not limited herein.

In this way, the consistency of the battery device may be determined based on the maximum value in all the differences between the characteristic values of the battery units and the corresponding relationship between the difference range and the consistency level to provide a reference for the use of the battery device.

Of course, in some embodiments, in addition to determining the consistency of the battery device according to the maximum value in all the differences between the characteristic values of the battery units, determining the consistency may also include the following.

A mean of all differences between the characteristic values of the battery units is calculated, and a consistency level corresponding to a difference range where the said mean is located is determined.

In this way, the differences of all battery units can be reflected, and the consistency of the battery device can be judged as a whole.

In some embodiments, the method also includes the following.

A maximum value in all the differences between the characteristic values of the battery units is determined.

According to a preset corresponding relationship between a difference range and an early warning level, an early warning level corresponding to a difference range where the maximum value is located is determined.

For example, the corresponding relationship between the difference range and the early warning level may be shown in Table 3.

TABLE 3

| Difference range | Early warning level |
|---|---|
| [c5, c6) | Level 1 |
| [c7, c8) | Level 2 |
| [c9, c10) | Level 3 |

Assuming that the determined difference range where the maximum value is located is [c7, c8), it means that the early warning level of the battery device is Level 2. If Level 1 represents the lowest level and Level 3 represents the highest level, it can be determined that the current battery device has a relatively large safety hazard, but the degree of safety hazard is neither high nor low and needs attention. If the battery device continues to be used, the possibility of danger is very high.

Assuming that the determined difference range where the maximum value is located is [c5, c6), it means that the early warning level of the battery device is Level 1. It can be determined that the current battery device has certain safety hazard, but the degree of safety hazard is small to remind the user of the battery device to pay attention to the usage situation of the battery device at any time.

Assuming that the determined difference range where the maximum value is located is [c9, c10), it means that the early warning level of the battery device is Level 3. It can be determined that the current battery device has a very large safety hazard and the use of the battery device needs to be immediately stopped.

Of course, the corresponding relationship between the difference range and the early warning level is not limited to that shown in Table 3. Here, Table 3 is used as an example for illustration. In actual situations, the corresponding relationship between the difference range and the early warning level may be preset according to actual requirements, which is not limited herein.

In this way, the early warning level of the battery device may be determined, which provides a reference for the subsequent use and maintenance of the battery device, and prevents danger from happening.

Of course, in some embodiments, in addition to determining the early warning level of the battery device according to the maximum value in all the differences between the characteristic values, determining the early warning level may also include the following.

A mean of all differences between the characteristic values is calculated, and an early warning level corresponding to a difference range where the mean of the characteristic values is located is determined.

In this way, the differences between the characteristic values of all the battery units can be reflected to judge the early warning level of the battery device as a whole.

In some embodiments, when the battery device is a battery pack, the battery unit is a battery module or a battery group.

Alternatively, when the battery device is a battery group or a battery module, the battery unit is a single battery.

Alternatively, when the battery device is a containerized battery system, the battery unit is a battery pack.

In this way, the detection method may judge the consistency difference of the three levels of the containerized battery system, the battery pack, and the battery module (or the battery group), which has a wide range of application fields and strong practicability.

In some embodiments, early warning, display, and recording may also be performed based on the determined consistency of the battery device to provide data reference for subsequent improvement and analysis of battery performance, and to provide the user with more intuitive data, so that the user can pay attention to the performance change of the battery device at any time, and prepare for the occurrence of danger in advance, which improves the safety of the battery device during the usage process.

Based on the same inventive concept, an embodiment of the disclosure provides a screening device of a battery unit. The implementation principle of the screening device is similar to the implementation principle of the screening method. For the specific implementation of the screening device, reference may be made to the specific implementation of the screening method, which will not be repeated.

Figure 5:
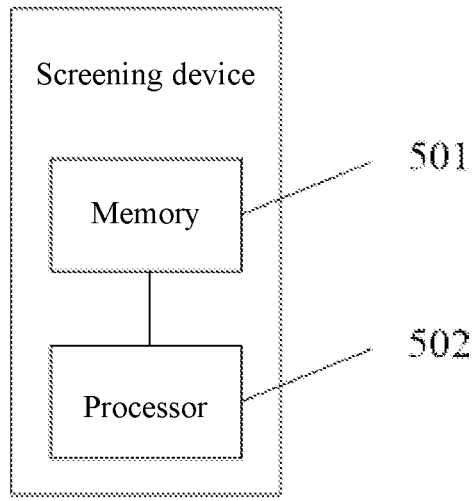
FIG. 5 is a schematic structural diagram of a screening device of a battery unit according to an embodiment of the disclosure.

Specifically, an embodiment of the disclosure provides a screening device of a battery unit, as shown in FIG. 5, which includes the following.

A memory 501 is used to store a program instruction.

A processor 502 is used to call the program instruction stored in the memory 501 to execute the screening method provided by the embodiment of the disclosure according to an obtained program.

Based on the same inventive concept, an embodiment of the disclosure provides a detection device of a battery device. The implementation principle of the detection device is similar to the implementation principle of the detection method. For the specific implementation of the detection device, reference may be made to the specific implementation of the detection method, which will not be repeated.

Figure 6:
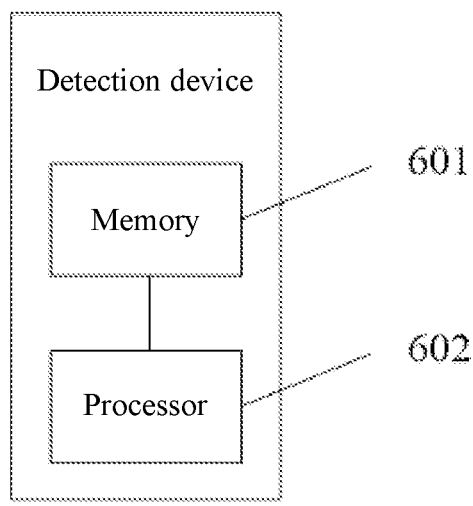
FIG. 6 is a schematic structural diagram of a detection device of a battery device according to an embodiment of the disclosure.

Specifically, an embodiment of the disclosure provides a detection device of a battery device, as shown in FIG. 6, which includes the following.

A memory 601 is used to store a program instruction.

A processor 602 is used to call the program instruction stored in the memory 601 to execute the detection method provided by the embodiment of the disclosure according to an obtained program.

In some embodiments, the detection device may be a certain module in a battery management system, and the module may be an existing module in the battery management system or a newly added module in the battery management system, as long as a detection function is integrated into the battery management system.

It will be apparent to persons skilled in the art that various modifications and variations may be made to the disclosure without departing from the spirit and scope of the disclosure. Thus, provided that the modifications and the variations of the disclosure fall within the scope of the claims of the disclosure and the equivalent technology thereof, the disclosure is also intended to include the modifications and the variations.

What is claimed is:

1. A battery device, comprising at least two battery units, wherein a difference between characteristic values of any one of the at least two battery units is controlled within a preset range,
   wherein the preset range is 0.5% to 40%,
   wherein each one of the characteristic values is obtained by adopting a following test:
   when any one of the at least two the battery units is discharged at a discharge rate of 0.05 Capacity (C) and a discharge rate of 1C respectively in a discharge voltage interval of 2.8 Volt (V) to 4.2V, obtaining two discharge differential voltage analysis (DVA) curves, and determining a difference between minimum values of the two discharge DVA curves to be as a characteristic value of one of the at least two battery units.

2. The battery device according to claim 1, wherein the preset range is 2% to 25%.

3. The battery device according to claim 1, wherein one of the characteristic values is in a range of 0.01 to 0.15.

4. The battery device according to claim 3, wherein one of the characteristic values is in a range of 0.04 to 0.1.

5. A screening method of a battery unit, comprising:
   determining a characteristic value of each of a plurality of battery units to be selected, wherein the characteristic value is determined according to a minimum value of a discharge DVA curve of the battery unit obtained during a discharge process;
   calculating a difference between the characteristic values of any two of the plurality of battery units; and
   selecting the battery unit with the difference between the characteristic values of any two of the plurality of battery units within a preset range, for assembling the selected battery unit to be loaded onto vehicles;
   wherein determining the characteristic value of each of the plurality of battery units to be selected comprises:
   for any one of the plurality of battery units, executing a following process:
   according to N different preset discharge conditions, respectively discharging any one of the plurality of battery units to obtain N corresponding discharge DVA curves, where N is an integer greater than 1;
   determining a minimum value in each of the discharge DVA curves;
   calculating a difference between any two of the minimum values; and
   according to the calculated difference between the minimum values, determining the characteristic value of the one of the plurality of battery units.

6. The screening method according to claim 5, wherein each of the N different preset discharge conditions comprises:
   a preset discharge rate; and
   according to a discharge DVA curve obtained by discharging a fully charged battery unit, determining a discharge voltage interval,
   wherein the preset discharge rates in the different preset discharge conditions are different, and the discharge voltage intervals in the different preset discharge conditions are the same.

7. The screening method according to claim 6, wherein a method for determining the preset range comprises:
   determining M battery unit samples, where M is an integer greater than 1;
   determining a characteristic value of each of the battery unit samples;
   calculating a mean and a variance of the characteristic values respectively; and
   according to the mean and the variance of the characteristic values, determining the preset range.

8. A screening device of a battery unit, comprising:
   a memory, used to store a program instruction; and
   a processor, used to call the program instruction stored in the memory to execute the screening method according to claim 6 according to an obtained program.

9. The screening method according to claim 5, wherein a method for determining the preset range comprises:
   determining M battery unit samples, where M is an integer greater than 1;
   determining a characteristic value of each of the battery unit samples;
   calculating a mean and a variance of the characteristic values respectively; and
   according to the mean and the variance of the characteristic values, determining the preset range.

10. A screening device of a battery unit, comprising:
    a memory, used to store a program instruction; and
    a processor, used to call the program instruction stored in the memory to execute the screening method according to claim 9 according to an obtained program.

11. A detection method of a battery device, comprising:
    when the battery device comprises a plurality of battery units, determining a characteristic value of each of the plurality of battery units, wherein the characteristic value is determined according to a minimum value of a discharge DVA curve of the battery unit obtained during a discharge process;

calculating a difference between the characteristic values of any two of the plurality of battery units, such that the battery unit with the difference between the characteristic values of any two of the plurality of battery units within a preset range is selected for assembling the selected battery unit to be loaded onto vehicles; and according to the difference between the characteristic values of any two of the plurality of battery units, determining a consistency of the battery device;

wherein determining the characteristic value of each of the plurality of battery units comprises:

for any one of the plurality of battery units, executing a following process:

according to N different preset discharge conditions, respectively discharging any one of the plurality of battery units to obtain N corresponding discharge DVA curves, where N is an integer greater than 1;

determining a minimum value in each of the discharge DVA curves;

calculating a difference between any two of the minimum values; and according to the calculated difference between the minimum values, determining the characteristic value of the one of the plurality of battery units.

12. The detection method according to claim 11, wherein according to the difference between the characteristic values of any two of the plurality of battery units, determining the consistency of the battery device comprises:

determining a maximum value in all the differences between the characteristic values of the plurality of battery units; and according to a preset corresponding relationship between a difference range and a consistency level, determining a consistency level corresponding to a difference range where the maximum value is located.

13. The detection method according to claim 12, further comprising:

determining a maximum value of all the differences between the characteristic values of the plurality of battery units; and according to a preset corresponding relationship between a difference range and an early warning level, determining an early warning level corresponding to a difference range where the maximum value is located.

14. A detection device of a battery device, comprising:
a memory, used to store a program instruction; and
a processor, used to call the program instruction stored in the memory to execute the detection method according to claim 13 according to an obtained program.

15. A detection device of a battery device, comprising:
a memory, used to store a program instruction; and a processor, used to call the program instruction stored in the memory to execute the detection method according to claim 12 according to an obtained program.

16. The detection method according to claim 11, further comprising:

determining a maximum value of all the differences between the characteristic values of the plurality of battery units; and according to a preset corresponding relationship between a difference range and an early warning level, determining an early warning level corresponding to a difference range where the maximum value is located.

17. A detection device of a battery device, comprising:
a memory, used to store a program instruction; and
a processor, used to call the program instruction stored in the memory to execute the detection method according to claim 16 according to an obtained program.

18. A detection device of a battery device, comprising:
a memory, used to store a program instruction; and
a processor, used to call the program instruction stored in the memory to execute the detection method according to claim 9 according to an obtained program.

19. A screening device of a battery unit, comprising:
a memory, used to store a program instruction; and
a processor, used to call the program instruction stored in the memory to execute the screening method according to claim 5 according to an obtained program.

* * * * *